US006424145B1

(12) United States Patent
Woolsey et al.

(10) Patent No.: US 6,424,145 B1
(45) Date of Patent: Jul. 23, 2002

(54) INDUCTIVE PROXIMITY SENSOR FOR DETECTING FERROMAGNETIC, NON-PERMEABLE OR MAGNET TARGETS

(75) Inventors: Kevin Woolsey, Snohomish; Jeff Lamping, Mountlake Terrace; John Marler, Woodinville; Bernie Burreson; Steve Knudson, both of Seattle, all of WA (US)

(73) Assignee: Eldec Corporation, Lynnwood, WA (US)

( * ) Notice: Subject to any disclaimer, the term of this patent is extended or adjusted under 35 U.S.C. 154(b) by 0 days.

(21) Appl. No.: 09/515,557

(22) Filed: Feb. 29, 2000

(51) Int. Cl.[7] ............................. G01R 35/00; G01B 7/14
(52) U.S. Cl. .............. 324/202; 324/207.16; 324/207.26
(58) Field of Search .................................. 336/213, 219, 336/196, 197, 210, 221, 198; 324/207.15, 207.16, 207.17, 207.26, 234, 117 R, 127, 202, 207.18, 207.19

(56) References Cited

U.S. PATENT DOCUMENTS 1,844,432 A * 2/1932 Lyndon ........................ 336/212
2,765,448 A * 10/1956 Duffing ....................... 336/221

(List continued on next page.)

FOREIGN PATENT DOCUMENTS

| DE | 42 33 325 A1 | 4/1994 |
| EP | 0 697 769 A1 | 2/1996 |
| FR | 2 496 969 | 6/1982 |
| GB | 1 073 432 | 6/1967 |

*Primary Examiner*—Edward Lefkowitz
*Assistant Examiner*—Reena Aurora
(74) *Attorney, Agent, or Firm*—Christensen O'Connor Johnson Kindness PLLC

(57) ABSTRACT

An omega-shaped core is wrapped with two coils arranged to be responsive to magnetic permeable metal and conductive metal objects. The omega core allows the proximity sensor to operate as a saturated core sensor, a variable reluctance sensor or an eddy current loss sensor. The core is made from a thin, highly permeable metal that is preferably formed from a single piece of sheet metal, and comprises a substantially flat, rectangular member bent in four locations to form a head portion, two legs, and two feet. The bends form right angles so that the head portion is perpendicular to the two legs, and the two legs are perpendicular to the two feet. The two feet are parallel to each other and also parallel to the head portion. The core is positioned in a housing with two inductive coils, each coil being positioned around a leg portion of the core. A calibration bolt can be placed through the center of the core to change the level of inductance measured from the two inductive coils.

48 Claims, 11 Drawing Sheets

U.S. PATENT DOCUMENTS

| | | | |
|---|---|---|---|
| 3,205,323 A | | 9/1965 | Deshautreaux, Jr. |
| 3,297,948 A | * | 1/1967 | Kohler ................. 324/173 |
| 3,502,966 A | | 3/1970 | Perets et al. |
| 3,643,155 A | | 2/1972 | Riddle et al. |
| 3,956,693 A | | 5/1976 | Zutrauen et al. |
| 4,117,401 A | | 9/1978 | Glauert |
| 4,140,971 A | | 2/1979 | Blincoe |
| RE30,012 E | | 5/1979 | Wilkas et al. |
| 4,166,977 A | * | 9/1979 | Glauret et al. ............ 324/173 |
| 4,387,339 A | | 6/1983 | Åkerblom |
| 4,553,040 A | | 11/1985 | Trüper et al. |
| 4,556,859 A | | 12/1985 | Sheppard |
| 4,587,486 A | | 5/1986 | Soyck |
| 4,618,823 A | | 10/1986 | Dahlheimer et al. |
| 4,719,362 A | | 1/1988 | Nest et al. |
| 4,853,575 A | * | 8/1989 | Lessig, III ............... 310/171 |
| 4,857,841 A | | 8/1989 | Hastings et al. |
| 4,868,498 A | | 9/1989 | Lusinchi et al. |
| 4,879,531 A | | 11/1989 | Tigges et al. |
| 4,924,180 A | | 5/1990 | Nasr et al. |
| 4,950,986 A | * | 8/1990 | Guerrero ............. 324/207.19 |
| 4,994,738 A | | 2/1991 | Soyck et al. |
| 5,012,206 A | | 4/1991 | Tigges ..................... 331/65 |
| 5,229,715 A | | 7/1993 | Niino et al. |
| 5,278,496 A | | 1/1994 | Dickmeyer et al. |
| 5,336,997 A | | 8/1994 | Anim-Appiah et al. |
| 5,351,004 A | | 9/1994 | Daniels et al. |
| 5,507,089 A | | 4/1996 | Dickmeyer |
| 5,670,886 A | * | 9/1997 | Wolff et al. ............... 324/644 |
| 5,712,621 A | | 1/1998 | Andersen |
| 5,767,672 A | | 6/1998 | Guichard et al. .......... 324/236 |
| 5,793,204 A | * | 8/1998 | Logue ..................... 324/228 |
| 5,801,340 A | | 9/1998 | Peter |
| 5,801,530 A | | 9/1998 | Crosby et al. |
| 5,814,986 A | * | 9/1998 | Goskowicz et al. ... 324/207.26 |
| 6,094,118 A | * | 7/2000 | Bulgatz ................... 335/278 |

* cited by examiner

INDUCTIVE PROXIMITY SENSOR FOR DETECTING FERROMAGNETIC, NON-PERMEABLE OR MAGNET TARGETS

FIELD OF THE INVENTION

The present invention relates to a non-contact proximity sensor and, more particularly, a proximity sensor having an increased sensing range and capable of sensing magnetic, ferromagnetic, and conductive targets.

BACKGROUND OF THE INVENTION

A proximity sensor is a device used to detect the presence of an object. The design of a proximity sensor can be based on a number of principles of operation, some examples include: variable reluctance, eddy current loss, saturated core, and Hall effect. Depending on the principle of operation, each type of sensor will have different performance levels for sensing different types of objects. In particular, saturated core and Hall effect sensors are primarily used to detect the presence of magnetic objects, while variable reluctance and eddy current loss sensors are primarily used to detect the presence of metal objects.

Saturated core sensors are known in the prior art. Such proximity sensors typically include a core made from a material that will magnetically saturate when exposed to a magnetic field of a certain flux density. As a magnetic object is moved toward the core assembly, a distance is reached where the magnetic field of the object finds the core to be the smallest reluctance path. As a result, the flux of the field enters the core and, as the distance is decreased the flux density increases and eventually saturates the core. The saturation of the core causes the impedance of the coil to decrease. By measuring changes in the impedance of the coil, the presence of the magnetic object may be detected.

One example of a saturated core sensor can be found in U.S. Pat. No. 4,719,362 to Nest et al. ("the Nest Patent"). The Nest patent discloses an inductive proximity sensor having a core, a conductive coil, and an oscillator circuit. The core is made from a metal that magnetically saturates when exposed to the magnetic field of a target.

Variable reluctance sensors are also known in the prior art. Such proximity sensors typically include a U-type core and coils wound around the core legs. Other typical shapes of variable reluctance proximity sensors cores include: Pot cores, pins, T-cores, E-cores and plates. These devices also typically include an electronic drive device for producing an oscillating electromagnetic field around the coil. Square waves, sine waves, trapezoidal waves, and other unique wave shapes have been used to interface to these sensors. As a permeable object is moved toward the variable reluctance proximity sensor, the permeable object reduces the reluctance of the electromagnetic system, and this variation in the reluctance is measured as a change in the inductance and AC resistance of the coil. When the permeable object moves toward a variable reluctance sensor, the inductance and AC losses of the coil increase.

In some designs, two coils are used, one to produce the electromagnetic field and another to measure the variations in the reluctance. In conventional variable reluctance proximity sensors, it has been common practice to use a ferrite core. The sensing coils are placed on the core to optimize the magnetic field extending to the target material. The core is shaped to contain and extend the electromagnetic field surrounding the coil in a sensing direction or to concentrate or channel the field in other directions, such as behind and to the sides of the coil. One example of a variable reluctance sensor is shown in U.S. Pat. No. 4,387,339 to Akerblom ("the Akerblom patent"). The Akerblom patent discloses an apparatus for measuring the distance between two moving objects.

Eddy current sensors are also known in the prior art. Such proximity sensors have a similar design to variable reluctance sensors in that they typically include Pot cores or U-type core, a coil wound around the center post of the core or the core legs, and an oscillator for producing an oscillating electromagnetic field around the coil. As with the variable reluctance proximity sensor, the eddy current sensor detects the presence of a conducting object by measuring the real and imaginary AC losses of the coil; however, in this design, if the target material is only conductive, the inductance of the coil decreases as the object is moved toward the target.

SUMMARY OF THE INVENTION

The present invention provides a proximity sensor that operates as a saturable core proximity sensor, a variable reluctance proximity sensor, and an eddy current proximity sensor. In the preferred embodiment, the core is made of a highly permeable metal. The preferred embodiment provides a durable, low cost, lightweight proximity sensor with increased sensitivity and additional manufacturing benefits.

The precision shaped metal core and the supporting assembly are designed to optimize the sensitivity of the device in three modes of operation. In one mode of operation, the proximity sensor is used to detect the presence of a magnet. When the magnet approaches the sensor, the unique shape and dimensions of the core allow for easy saturation of the core in the magnetic field. When the magnet is close to the sensing device, the core saturates and significantly changes the impedance of a coil configured around the core. A first sensing circuit connected to the coil is used to detect variations in the impedance and configured to provide a signal to indicate the presence of a magnetic object when the coil impedance fluctuates.

In a second mode of operation, the proximity sensor is used to detect the presence of ferromagnetic metals objects, also referred to as permeable metals. In this mode, the coils around the core provide a source field and also provide a means for measuring variations in source field. When a permeable object moves into the source field, the inductance of the coil increases. A second sensing circuit connected to the coil is used to detect variations in the inductance of the coil and configured to provide a signal to indicate the presence of a ferromagnetic target when the coil inductance fluctuates. The highly permeable steel sensor core provides a design with increased sensitivity for detecting ferromagnetic objects at increased ranges.

In a third mode of operation, the proximity sensor is used to detect the presence of conductive objects, such as copper or aluminum. In this mode, the inductance of the coil decreases when a conductive object moves into the source field. The second sensing circuit connected to detect variations in the inductance of the coil. Similar to the variable reluctance mode, when a permeable object moves into the source field, the inductance of the coil increases. A second sensing circuit connected to the coil is used to detect variations in the inductance of the coil and configured to provide a signal to indicate the presence of a ferromagnetic target when the coil inductance fluctuates. The highly permeable steel sensor core also provides a design with increased sensitivity for detecting conductive objects at increased ranges.

A specific core design that can be used in the present invention is a thin, highly permeable metal that is preferably formed from a single piece of sheet metal. The core comprises a substantially flat, rectangular member bent in four locations to form a shape that resembles a rectangular Greek omega character having a head, two legs, and two feet. The bends are right angles with 60 degree bend radii so that the head is perpendicular to the two legs, and the two legs are perpendicular to the two feet. The two feet are parallel to each other, occupy a common plain and also parallel to the head.

The core is positioned in a housing with two inductive coils, each coil being positioned around one of the feet of the core. Another embodiment of the present invention also provides a core and coil assembly with a calibration bolt that is placed through the center of the core to adjust the inductance range of the proximity sensor.

The thin metal structure of the core also provides many other benefits in the manufacturing process of the proximity sensor. Specifically, the thin metal core allows for a more efficient manufacturing process that does not require a considerable amount of machine work, as compared to the prior art U-type metal cores. The core design also provides a rugged, lightweight structure that is not susceptible to great temperature fluctuations. Another advantage of the present invention is that it can be used as a permeable metal target sensor, an eddy-current-loss sensor, or a magnetic field sensor without the need of special preparations to switch the detectors for different types of applications. The proximity sensors of the present invention also provide a core design with increased sensitivity while having a design that is produced in a sufficiently small size.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

While advances have been made in the design of proximity sensors to improve their range and sensitivity, improvements of the various proximity sensors have not focused on providing a proximity sensing device that operates efficiently under different principles of operation. More specifically, prior art proximity sensors that have been developed to operate as a variable reluctance sensor do not operate efficiently as a saturated core sensor. Accordingly, prior art proximity sensors that have been designed to operate as a saturated core sensor do not operate well as a variable reluctance sensor. The present invention provides a core design that is able to operate under both principles of operation and provide a core design that also operates as an eddy current loss sensor. The present invention provides a highly sensitive, low cost, rugged core design that can operate under different principles of operation and that can detect multiple classes of target materials. In particular, the present invention provides a proximity sensor that is of a relatively straightforward structure that makes use of elements common to existing sensors, and adapted to accommodate magnetic and non-magnetic metal objects.

In addition, the present invention provides a core design with an extended sensing field without the need of a ferrite material or machined metal core. Proximity sensors that use ferrite cores have a degradation in their performance due to fluctuations in operating temperatures, age and particular material properties, such as brittleness and variance in initial material conditions. Other proximity sensors using a machined metal or metal laminated cores have been used in the art; however, these core designs are typically more difficult and more expensive to manufacture. The core design of the present invention using a thin permeable material provides increased performance as well as providing other manufacturing benefits.

The present invention provides a proximity sensor that operates as a saturable core proximity sensor, a variable reluctance sensor, and an eddy current loss sensor. In one mode of operation, the proximity sensor is used to detect the presence of a magnet. In another mode of operation, the proximity sensor is used to detect ferromagnetic objects or permeable targets. In yet another mode of operation, the proximity sensor is used to detect conductive targets such as copper or aluminum, along with any combination thereof. Target material recognition, and combining materials in a target are common methods of improving discriminating functions. The structure and methods of different embodiments of the present invention will become more readily apparent from the following detailed description, when taken in conjunction with the accompanying FIGURES.

Figure 1:
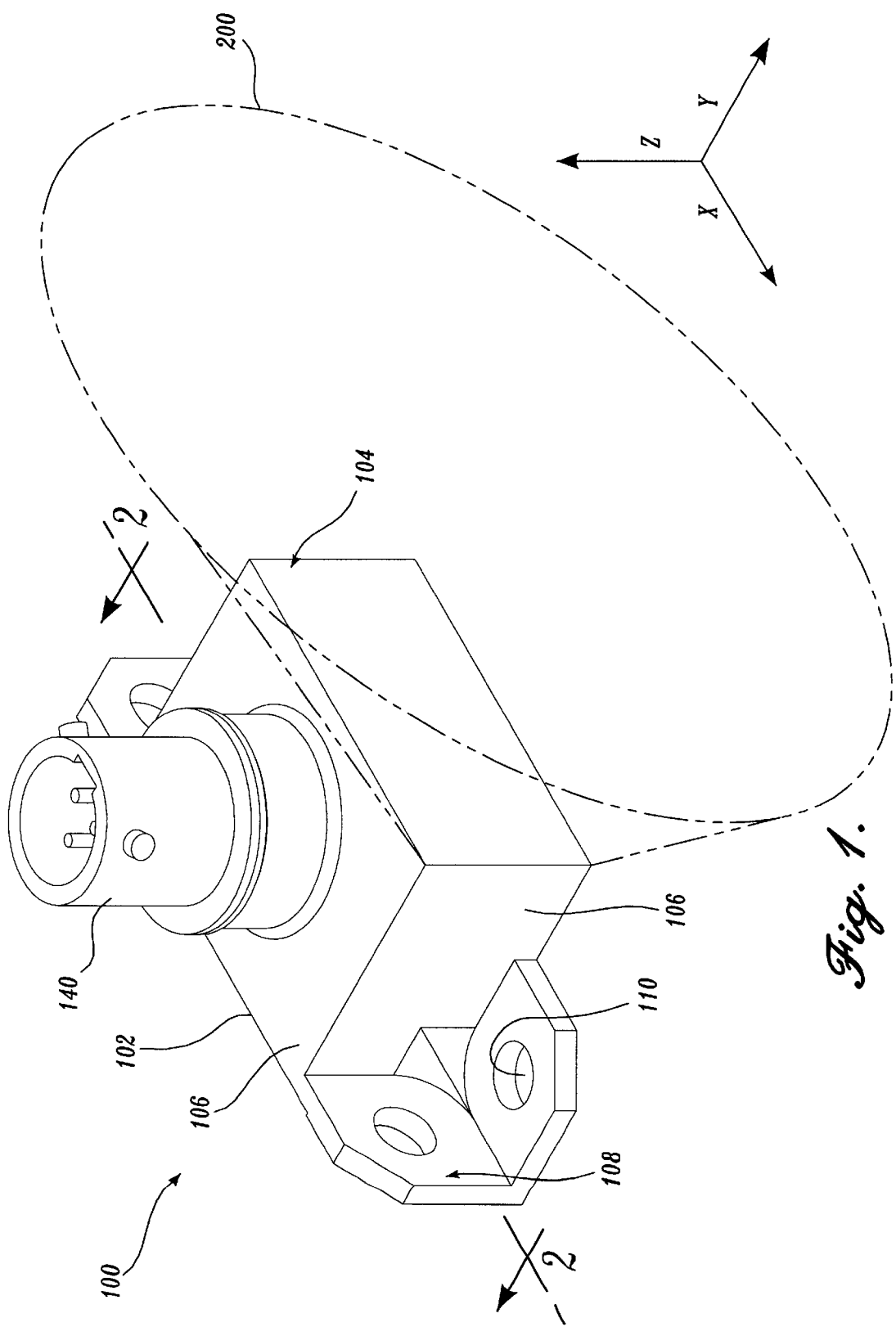
FIG. 1 is a top front perspective of one embodiment of a proximity sensor in accordance with the present invention.
Figure 2:
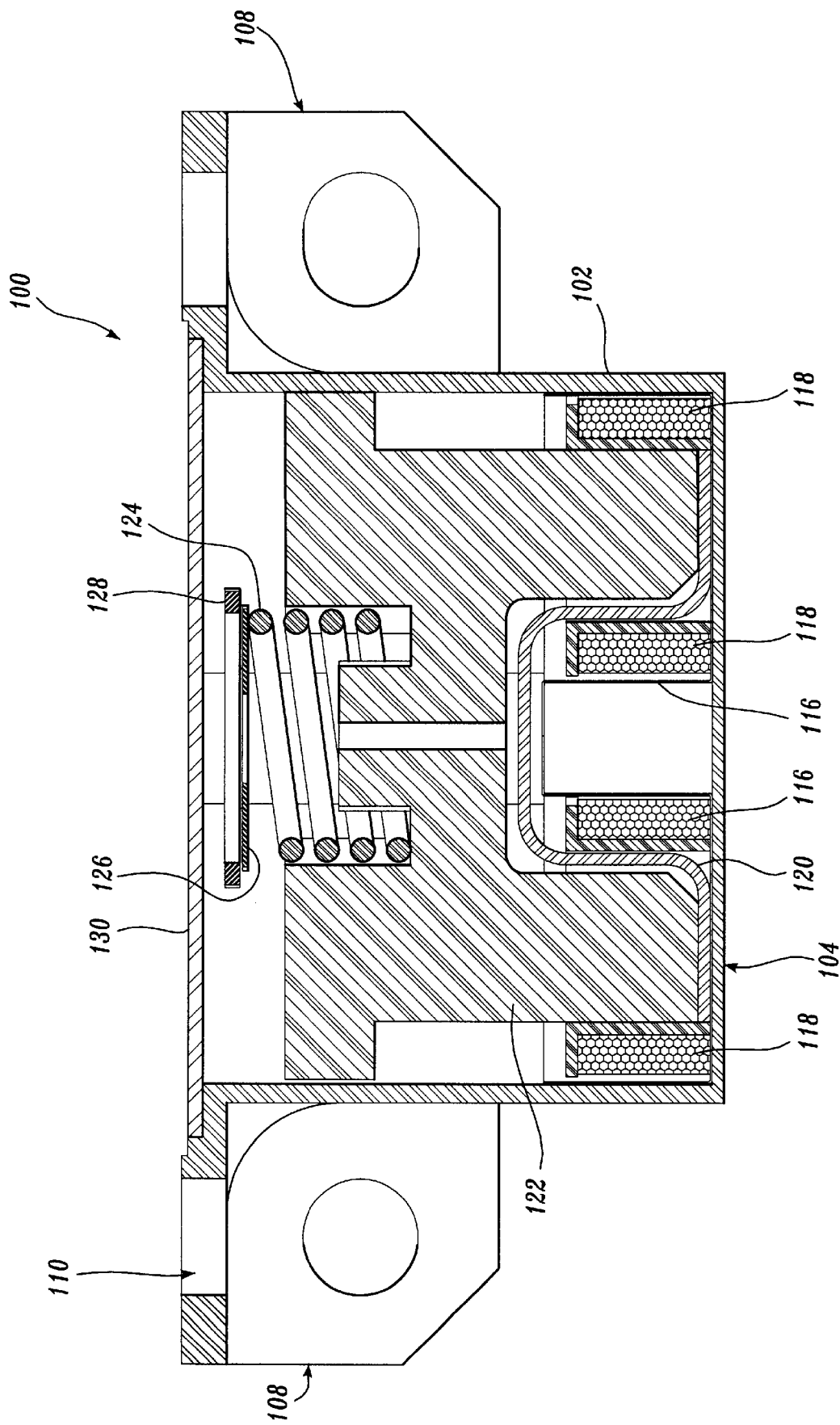
FIG. 2 is a section along line 2—2 of FIG. 1.

With reference to FIGS. 1 and 2, a first embodiment of a proximity sensor 100 in accordance with the present invention includes a housing 102 having a target-facing front surface 104 and four sidewalls 106 extending at right angles from surface 104. The sidewalls 106 and front surface 104 form a hollow interior region in the housing 102. As shown diagrammatically in broken lines in FIG. 1, a sensing region 200 extends out from the target-facing front surface 104 in a generally hemispherical shape. For example, in a representative embodiment, the proximity sensor 100 can have an effective sensing range of approximately 0.8 inches in the Y direction (around to the front 104) and an effective range diameter of approximately 1.5 inches in the X-Z plane (parallel to the surface 104). The proximity sensor 100 in FIG. 1 is effective for detecting magnetic, permeable, and nonpermeable conductive metallic targets in the sensing region 200.

The housing 102 includes two flanges 108 extending outward from the opposite sidewalls 106. The flanges 108 have apertures 110 to permit the proximity sensor 100 to be mounted on a support member by the use of bolts or screws, such as on a frame or sash for a closure member. The housing 102 is preferably made from a durable, non-magnetic material having a fairly low electrical conductivity, i.e., a conductivity level approximate to titanium. It is preferred that a physically strong, low conductivity, non-corrosive and non-magnetic material, like titanium or stainless steel be used in the construction of housing 102. However, to maximize the performance of the proximity sensor, other nonconducting materials such as formable plastics can be used to construct the housing 102. The performance of the sensor increases as the conductivity of the housing 102 decreases. The use of a highly conductive materials should be avoided because eddy currents may form on the housing surface and reduce the effective range 200 of the proximity sensor 100. In addition, the use of ferromagnetic materials should be avoided because the housing 102 may contain the sensing field produced by the proximity sensor 100.

Figure 3:
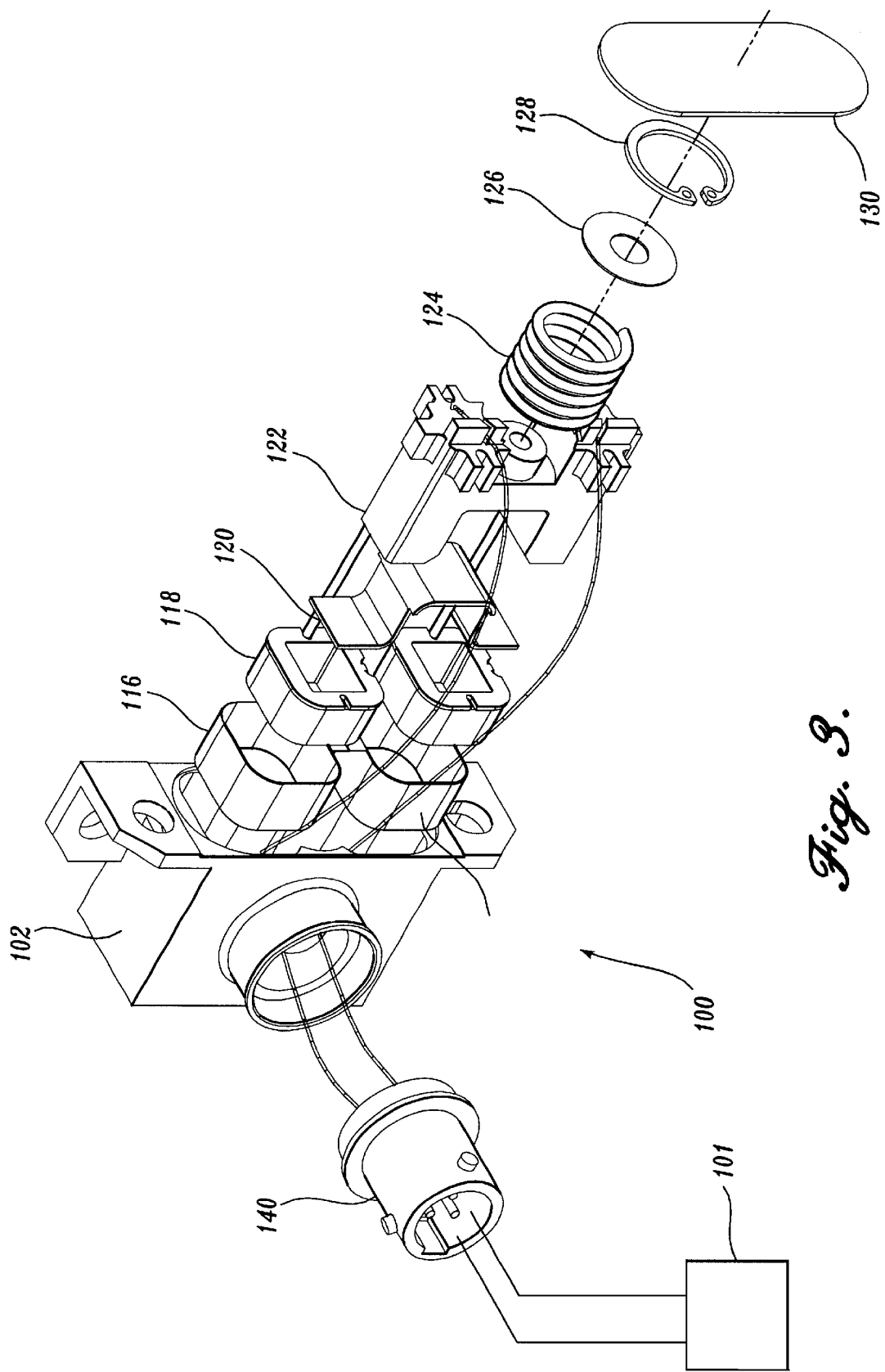
FIG. 3 is a top rear perspective of the proximity sensor of FIG. 1, with parts shown in exploded relationship.

The housing 102 also includes a rear opening to the hollow interior for the insertion of the internal components. Referring now to FIG. 3, the proximity sensor 100 is assembled by sliding the two insulators 116 into the opening of the housing 102. The two insulators 116 are preferably constructed from a nonconductive material such as plastic or Mylar with a thickness approximate to three Mils. The two insulators 116 may be molded in a cup shaped form to provide an insulating shield between two coil assemblies 118 and the housing 102.

The two coil assemblies 118 are then inserted into the two insulators 116. The two coil assemblies 118 comprise a plurality of turns of a relatively fine copper wire with a preferred gauge of thirty-seven. Although a gauge of thirty-seven is preferred, the two coil assemblies 118 may be constructed from any insulated wire material with a gauge range from twenty-six to fifty. From a view looking into the opening of the housing 102, the coil assemblies are formed by turning the wire of one coil in a clockwise direction and by turning the wire of the second coil in a counter-clockwise direction. Either coil may have the wire turn in the clockwise direction so long as the wire in the other coil is turned in the opposite direction. One wire from one coil should be connected to one wire from the other coil to create a closed loop circuit between the two coils. The other two open ends of each coil are connected to electrical contacts in an external connector 140.

The closed loop circuit formed by the coil wires is connected to a circuit 101 external to the housing 102. Two different circuits can be connected to the two coil assemblies 118 through the external connector 140 to accommodate three modes of operation. For the saturated core mode of operation, the closed circuit created between the two coil assemblies is connected to a circuit that has the capability of measuring the impedance of the two coils. This arrangement allows the proximity sensor 100 to detect the presence of magnetic targets. The impedance measuring circuit used in this configuration can be similar to a circuit that is commonly used in the art to measure impedance, such as an impedance meter.

In the other two modes of operation, the closed loop circuit created between the two coil assemblies is connected to a circuit having the capability to detect inductance of the two coils and to provide an alternating current to the two coils. This arrangement allows the proximity sensor 100 to detect the presence of permeable and conductive objects by sensing variations in the inductance of the two coils. The inductance measuring circuits used in these configurations are similar to those circuits that are commonly used in the art to operate common variable reluctance and eddy current loss proximity sensors, or again, an impedance meter.

The two coil assemblies 118 are also suitably formed in a rectangular configuration to accommodate the insertion of the core's foot portions. As described below, one embodiment of the core 120 has foot portions having a width of 0.292 inches and a length of 0.275 inches, thus the core should have a center opening of approximately 0.302 by 0.285 inches. The height of the coil in this embodiment should be approximately 0.250 inches.

After the two coil assemblies 118 are inserted, the core 120 is placed into the housing 102, such that the legs of the core 120 fit tightly into the openings of the two coil assemblies 118. FIGS. 4A–4D illustrate various views of the core 120 to show the unique aspects of its design. The core 120 comprises a substantially flat, rectangular member bent in four locations to form a shape that resembles a rectangular Greek omega character-having a head portion 220, two leg portions 222, and two foot portions (feet) 224. The bends are at right angles so that the head portion 220 is perpendicular to the two legs 222, and the two legs are perpendicular to the two feet 224. The two feet 224 are parallel to each other and coplanar, extend oppositely from the respective legs. Both feet portions 224 are also parallel to the head portion 220.

Figure 4A:
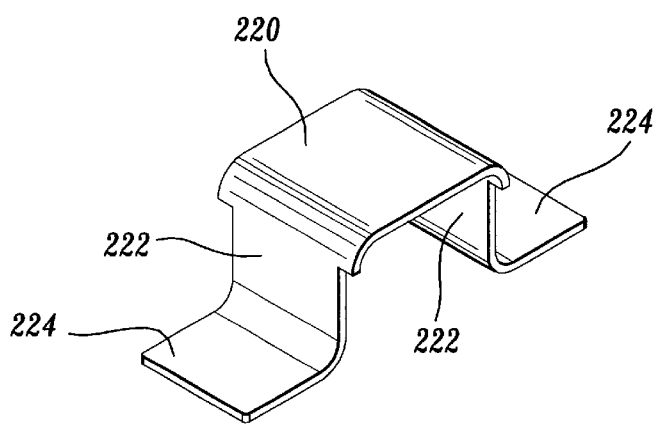
FIG. 4A is an enlarged perspective of the core used in the proximity sensor of FIGS. 1–3.
Figure 4B:
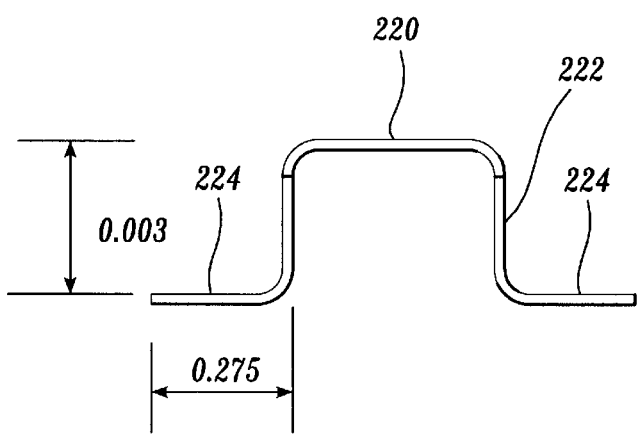
FIG. 4B is a side elevation of FIG. 4A.
Figure 4C:
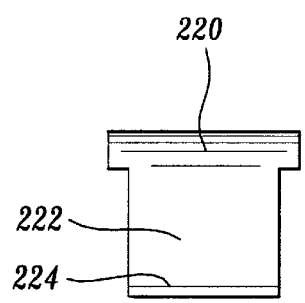
FIG. 4C is an end elevation thereof.
Figure 4D:
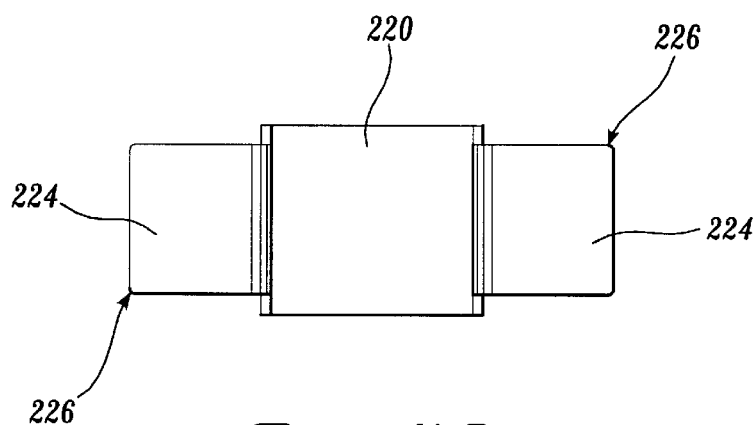
FIG. 4D is a bottom plan thereof.

The head portion of the core 220 has a preferred width of 0.370 inches and a preferred length of 0.39 inches. The two legs 222 that extend at right angles from the head portion 220 have a preferred width of 0.292 inches and a preferred length of 0.300 inches. The two feet 224 extend away from each other and have a preferred length of 0.275 inches and preferred width of 0.292 inches. As illustrated in FIG. 4B, if the omega shaped core is positioned to stand on the two feet 224, the core would have a height of 0.320 inches and a total length of 0.94 inches.

FIGS. 4A–4D also show that the top section of each of the two legs has a width equal to the width of the head portion 220, and the bottom section of each leg has a width that is more narrow than the width of the top section. The wider top section should extend down each leg approximately 0.050 inches. Accordingly, the more narrow bottom section of the each leg should extend down the remaining portion of each leg having a length of approximately 0.250 inches.

The core 120 is preferably constructed from a highly permeable material such as soft iron, cast iron, transformer steel, or any other like material. The relative permeability should be at least 10,000. Although a relative permeability is suggested to be at least 10,000, higher values are desired to increase the sensor's performance. One material that is preferred is referred to in the art as HyMu "80"®, available from Carpenter Steel Company of New Jersey. It is also preferred to form the core from one piece of metal with a thickness of approximately 0.020 inches. Although this embodiment shows a core with a thickness of 0.020 inches, the core thickness can range from 0.0005 to 0.050 inches.

Also shown in FIGS. 4A–4D, each of the four bends in the metal sheet that make up the core 120 should have a precise radius bend of 0.060 inches. More specifically, the arc of each bend should form a quarter circle having a radius of 0.060 inches. These precise bends apply to the bends between all surfaces of the core 120. In addition, it is also important to note that the corners 226 of the core also require a radial measurement. Each corner 226 should have a curvature that creates an arc with a maximum radius bend of 0.020 inches. Accordingly, all corners or edges that form a sharp edge should be ground down or properly finished as sharp corners on the core will reduce the sensing performance. The tolerances for these radius bends and the core measurements listed above are ±0.005 inches for linear measurements and ±5 degrees for the right angle bends.

Since cold bends in the metal change the magnetic properties of the core, an annealing process should be applied to the core to properly complete its construction. Thus, after the bends are made, the core should be cleaned such that all contaminants such as oil, grease, lacquer, and water, are removed from the core surface. In addition, the core should not be exposed to carbon, sulfur, or nitrogen during the annealing process. Once properly cleaned, the core is preferably annealed in an oxygen free, dry hydrogen atmosphere with a dew point below –40 degrees Celsius during the entire hydrogen annealing stage. If multiple cores are annealed at this part of the process, an insulating powder should be used to keep the cores from touching other cores or other objects. Preferred insulating powders include: magnesium, aluminum oxide, clean ceramic paper or an equivalent clean ceramic material.

The core should be annealed for seven to eight hours at temperature range between 1121 to 1177 degrees Celsius. After the seven to eight hour period, the core should be furnace cooled to a temperature approximate to 593 degrees Celsius. Once the core is cooled to 593 degrees Celsius, the core should be cooled at a rate between 260 and 316 degrees Celsius per hour to 371 degrees Celsius and then furnace cooled until the room temperature is reached.

Returning to FIG. 3, after the core 120 is placed into the housing 102, a spyder 122 is inserted on top of the core 120 to affix the core 120 and the two coil assemblies 118. The spyder 122 is preferably made from a nonconductive material such as a glass filled polymer. An adhesive can be used to secure the spyder 122 to the coils 118. A spring 124 and washer 126 are then placed on the spyder 122 and a snap ring 128 is used to secure the spring 124 and washer 126 to the spyder 122. Machined groves lined in the inside wall of the housing 102 receive the snap ring 128 to hold the snap ring 128 down onto the washer 126 and spring 124.

The cover 130 can be affixed to the housing 102 by a metal welding with a minimum weld penetration of 0.010 inches. Similar to the housing 102, the cover 130 is preferably made from a non-magnetic material with low conductivity such as titanium or stainless steel.

A proper seal between the metal cover 130 and the metal housing 102 prevent adverse effects caused by lightning strikes or other external sources of electrical current. This allows the proximity sensor 100 to provide consistent, repeatable proximity detection information even in the presence of relatively strong electromagnetic fields generated by current from a source external to the sensor assembly. For instance, when proximity sensor 100 is installed in an aircraft, the latter may be subjected to lightning strikes having a peak current of 200 KA or more. This current, which sheets along the outer skin of the aircraft, generates electromagnetic fields having an intensity of 10,000 amps/M or more, which fields may intercept the proximity sensor 100 when positioned adjacent to the outer skin of the aircraft. Such fields could temporarily adversely affect the operation of proximity sensor 100 by saturating core, thereby causing the inductance of coil to decrease to a level indicative of a magnetic target.

Figure 5:
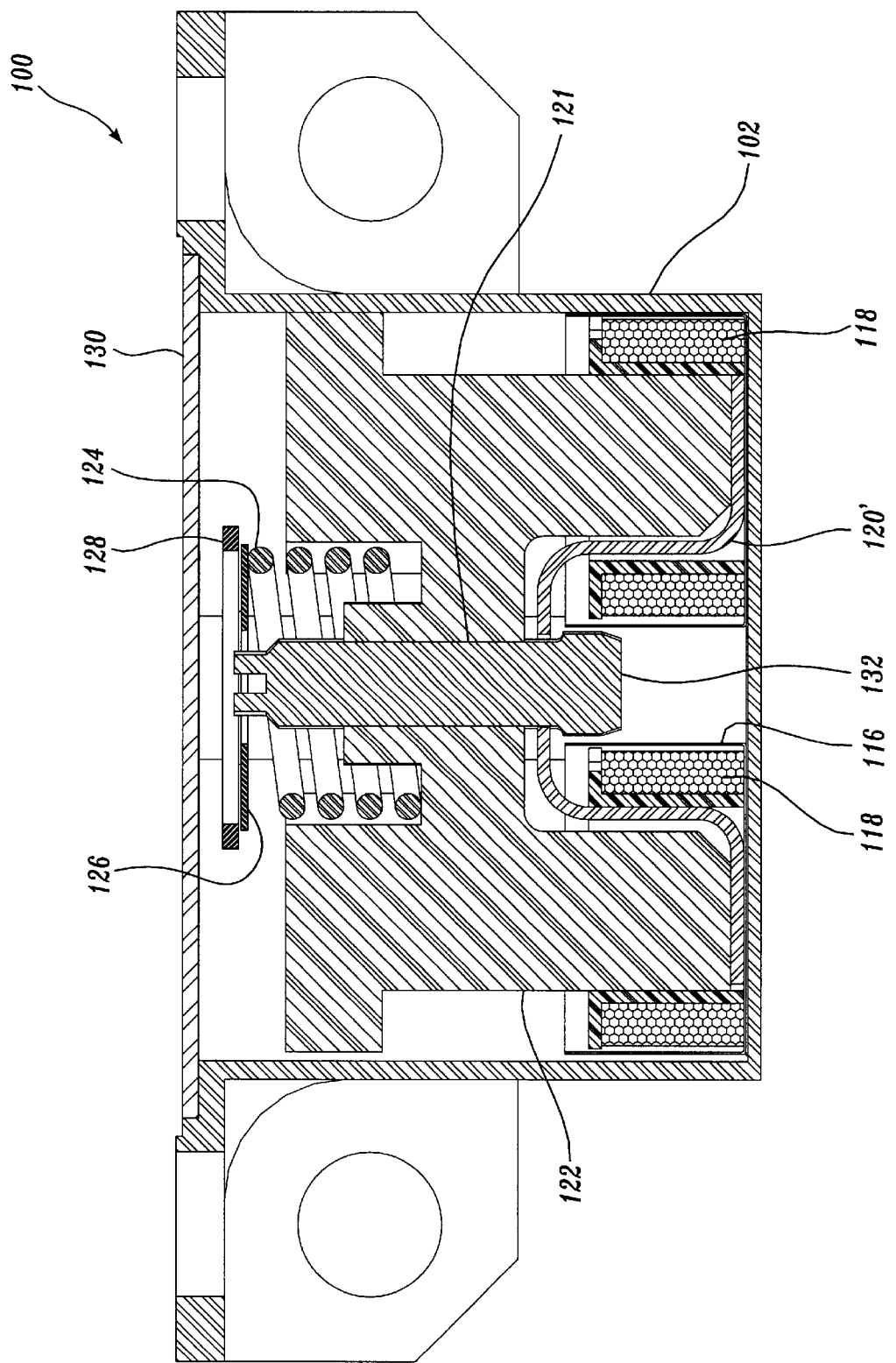
FIG. 5 is a section corresponding to FIG. 2, but showing another embodiment of a proximity sensor in accordance with the present invention.
Figure 6A:
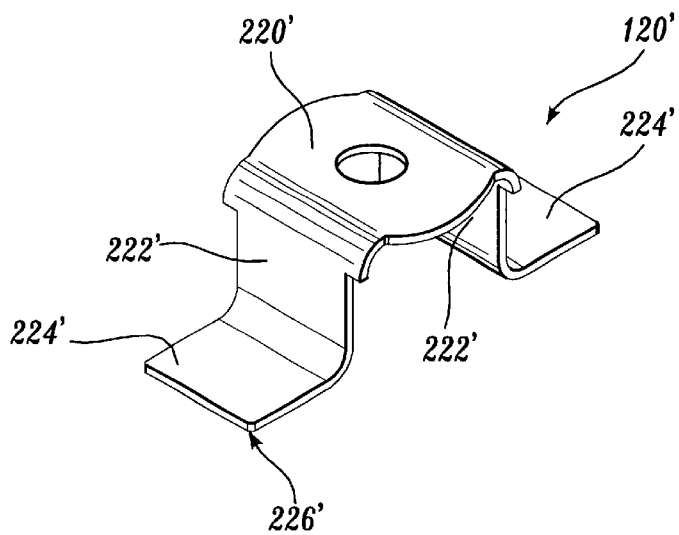
FIG. 6A is an enlarged perspective of the core used in the proximity sensor of FIG. 5.
Figure 6B:
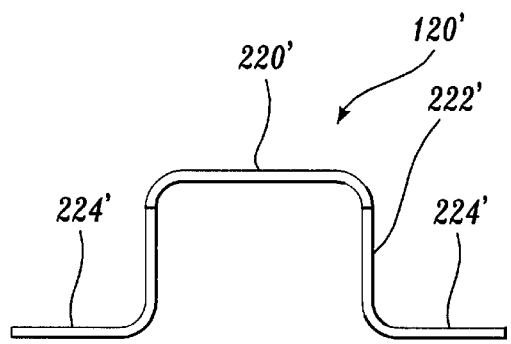
FIG. 6B is a side elevation of FIG. 6A.
Figure 6C:
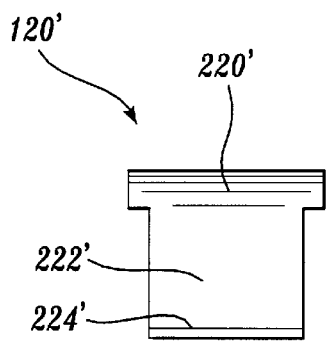
FIG. 6C is an end elevation thereof.
Figure 6D:
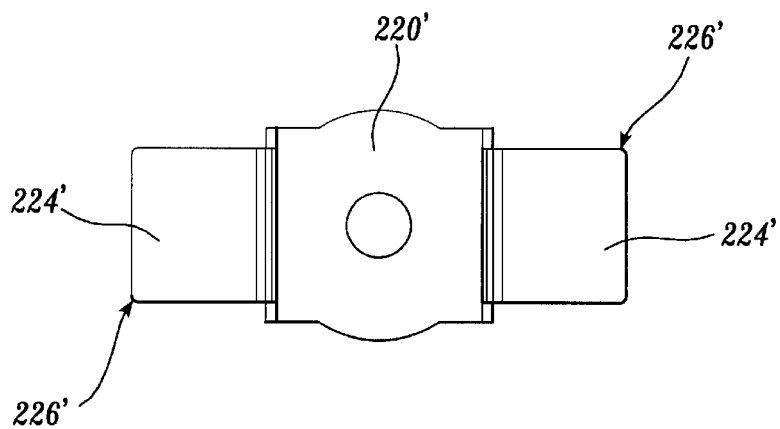
FIG. 6D is a bottom plan thereof.

The embodiment of proximity sensor 100 in accordance with the present invention shown in FIG. 5 is constructed in a manner similar to the proximity sensor shown in FIGS. 2 and 3. The main difference in the embodiment of FIG. 5 is that a calibration bolt 132 is inserted through the center of the core 120'. The calibration bolt 132 is used to change the level of inductance that is measured from the coils to accommodate the external circuitry.

Much like the material of the core 120', the calibration bolt 132 is preferably constructed from a highly permeable material such as soft iron, cast iron, transformer steel, or any other like material. The calibration bolt 132 should have a relative permeability of approximately 90 or higher. As with the material of the core 120', the performance of the device is increased as the relative permeability of the calibration bolt 132 is increased.

The core utilized in the embodiment employing the calibration bolt 132, shown in FIGS. 6A–6D, is similar to the core of FIGS. 4A–4D. The core 120' of FIGS. 6A–6D comprises a substantially flat, rectangular member bent in four locations to form a shape that resembles a rectangular Greek omega character having a head portion 220', two legs 222', and two foot portions (feet) 224'. The core of FIGS. 6A–6D also comprises an aperture in the center of the head portion 220' sized to receive the calibration bolt 132. In addition, the center of the head portion 220' has an extended width to provide additional strength to the core's structure and to improve the sensitivity of the proximity sensor.

The core 120' of FIGS. 6A–6D is also shaped with bends at right angles so that the head portion 220' is perpendicular to the two legs 222', and the two legs are perpendicular to the two feet 224'. The two feet 224' are parallel to each other and coplanar, extend oppositely from the respective legs. Both feet portions 224' are also parallel to the head portion 220'.

The top section of each of the two legs has a width equal to the width of the head portion 220', and the bottom section of each leg 222' has a width that is more narrow than the width of the top section. The wider top section should extend down each leg approximately 0.050 inches. Accordingly, the more narrow bottom section of the each leg should extend down the remaining portion of each leg having a length of approximately 0.250 inches.

Similar to the core 120 of FIGS. 3A–3D, each of the four bends in the metal sheet that make up the core 120' should have a precise radius bend of 0.060 inches. More specifically, the arc of each bend should form a quarter circle having a radius of 0.060 inches. These precise bends apply to the bends between all surfaces of the core 120'. In addition, it is also important to note that the corners 226' of the core also require a radial measurement. Each corner 226' should have a curvature that creates an arc with a maximum radius bend of 0.020 inches. Accordingly, all corners or edges that form a sharp edge should be ground down or properly finished, as sharp corners on the core will reduce the sensing performance. The tolerances for these radius bends and the core measurements listed above are ±0.005 inches for linear measurements and ±5 degrees for the right angle bends.

As described above, the proximity sensor 100 is used to detect three different types of objects. In one mode of operation, the proximity sensor 100 is used to detect the presence of objects that emit a magnetic field such as a magnetically charged iron. When used in this mode of operation, the proximity sensor 100 operates as a saturated core sensor. In another mode of operation, the proximity sensor 100 is used to detect the presence of permeable objects, also known as ferromagnetic metals. When used in this second mode of operation, the proximity sensor 100 operates as a variable reluctance sensor. In yet another mode of operation, the proximity sensor 100 is used to detect the presence of conductive metals or nonferrous objects such as aluminum, copper, brass or other like metals. When used in this third mode of operation, the proximity sensor 100 operates as an eddy current loss sensor.

Figure 7:
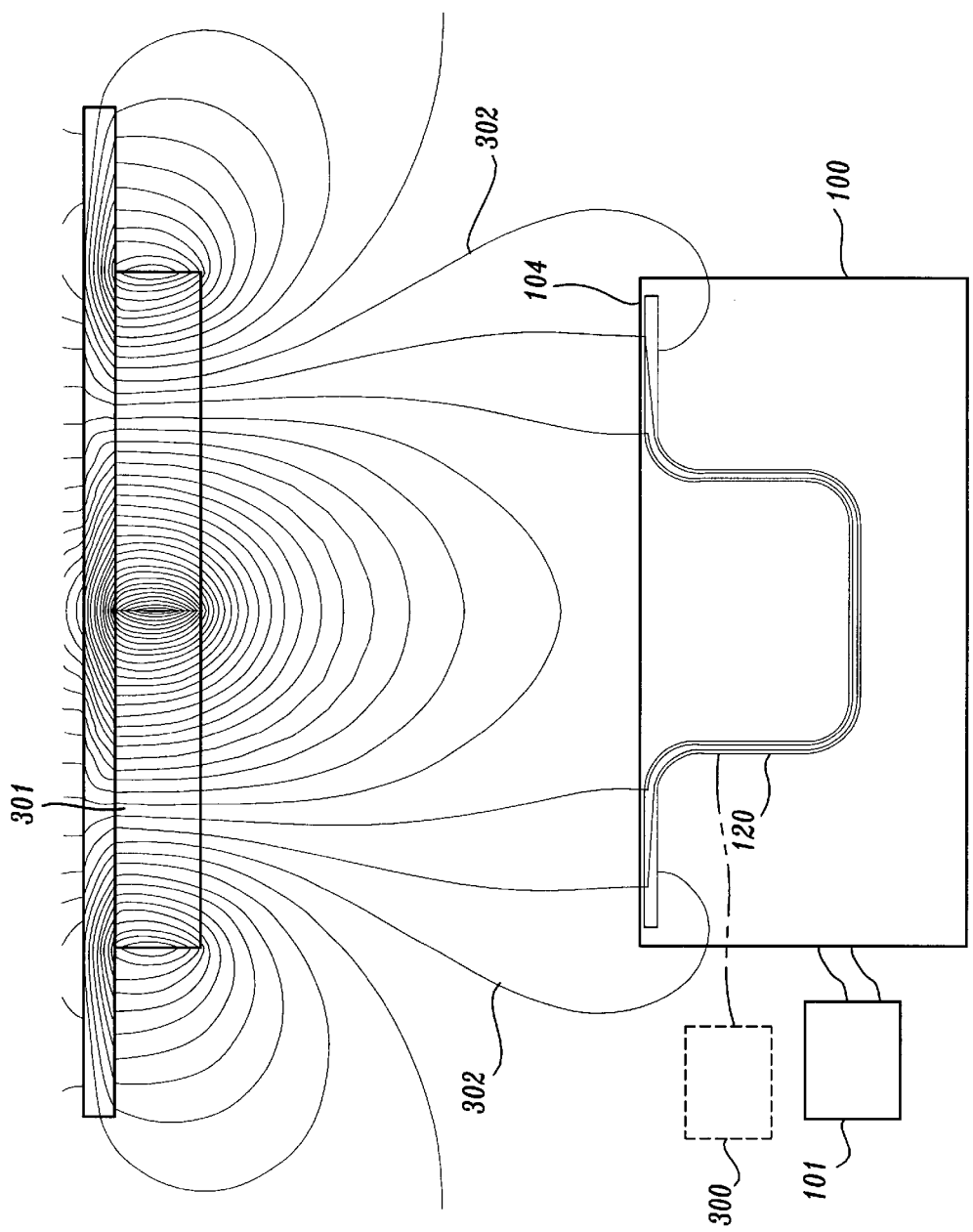
FIG. 7 is a somewhat diagrammatic top plan of a proximity sensor in accordance with the present invention adjacent to a magnetic target.

FIG. 7 illustrates the proximity sensor 100 used as a saturated core sensor to detect a magnetic object 301. The target facing surface 104 of the proximity sensor 100 is directed toward a magnetic object 301 producing a magnetic field 302. As the magnetic object 301 moves toward the proximity sensor 100, a point is reached where flux lines 302 begin to enter the core 120 and follow the core as the least reluctant path. As the proximity sensor 100 is moved deeper into the magnetic field, the core 120 begins to react to the magnetic field, thus changing the impedance value of the coils surrounding the core 120. Eventually, the core reaches a level of saturation where the impedance value of the coil significantly reacts to the changed state of the core 120. This reaction in the impedance value in relation to the saturation level is shown in FIG. 8.

Figure 8:
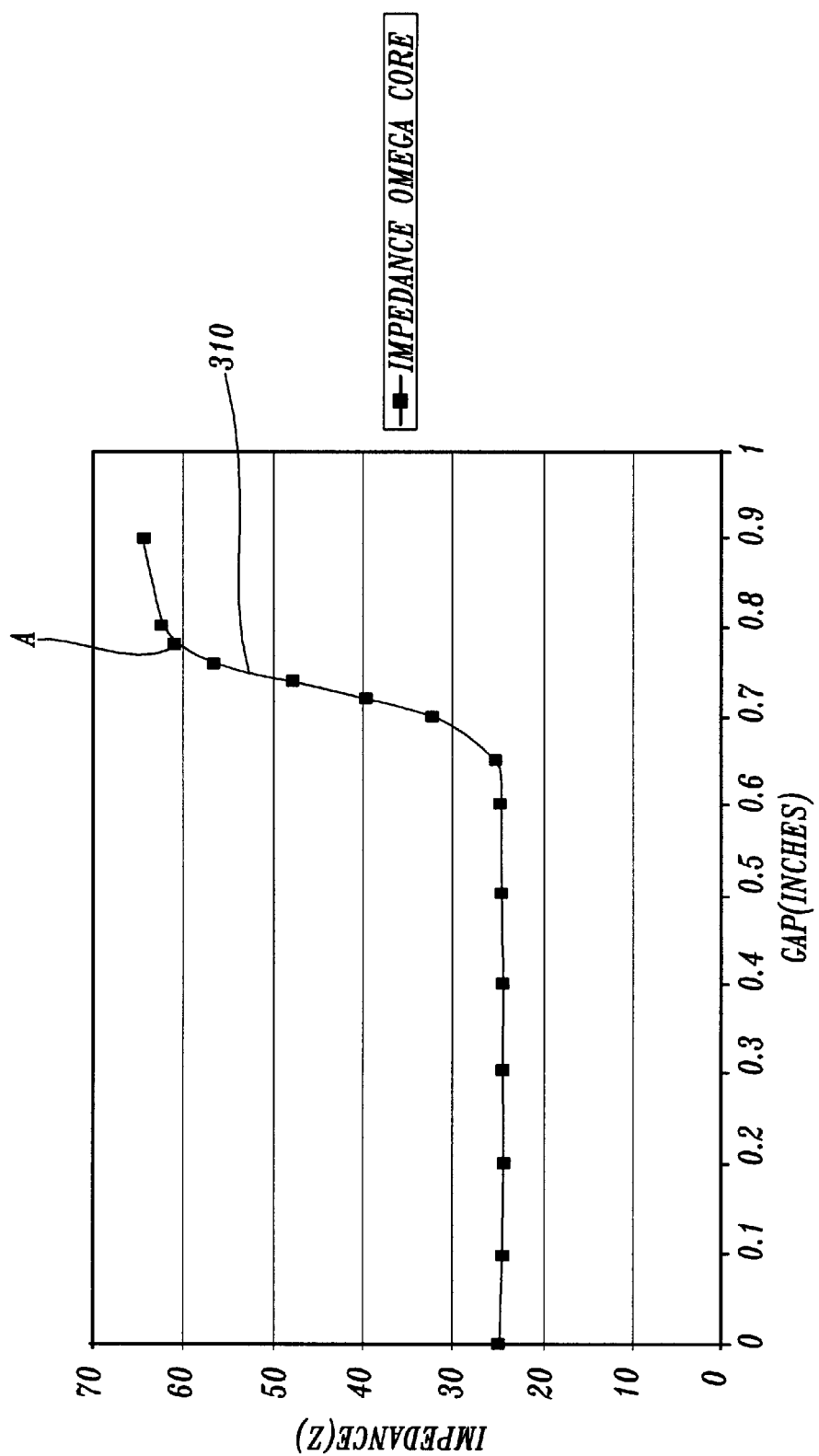
FIG. 8 is a graph of the impedance of the sensor coils as a function of the distance between the magnetic target and the proximity sensor of FIG. 6.

FIG. 8 is a graph of the coil impedance versus the distance between the magnetic object and the proximity sensor 100. As illustrated by the line 310, when the magnetic object 301 reaches a distance of approximately 0.8 inches (indicated by point A), the core begins to saturate. From this distance of 0.8 inches, as the magnetic object 301 moves toward the proximity sensor 100, the impedance significantly decreases as the core begins to saturate. When the core saturates, the impedance of coil drops rapidly from a relatively high value representing virtually no saturation of the core to a relatively low value representing virtually complete saturation of the core. The "no saturation" inductance level is represented by the upper horizontal portion of inductance curve 310 in FIG. 8, and the "complete saturation" inductance level is represented by the lower horizontal portions of curve 310.

Thus, by measuring the impedance levels in the coils, the presence of a magnetic object can be detected. The physical dimensions of the core determine when the core reaches magnetic saturation. The unique design of the present invention provides optimal performance of a saturated core proximity sensor as characterized in the graph of FIG. 8. As a result of the unique shape and dimensions of the core, the core will saturate at a greater distance away from the magnetic field source than a conventional U-type core of an equivalent size.

Figure 9:
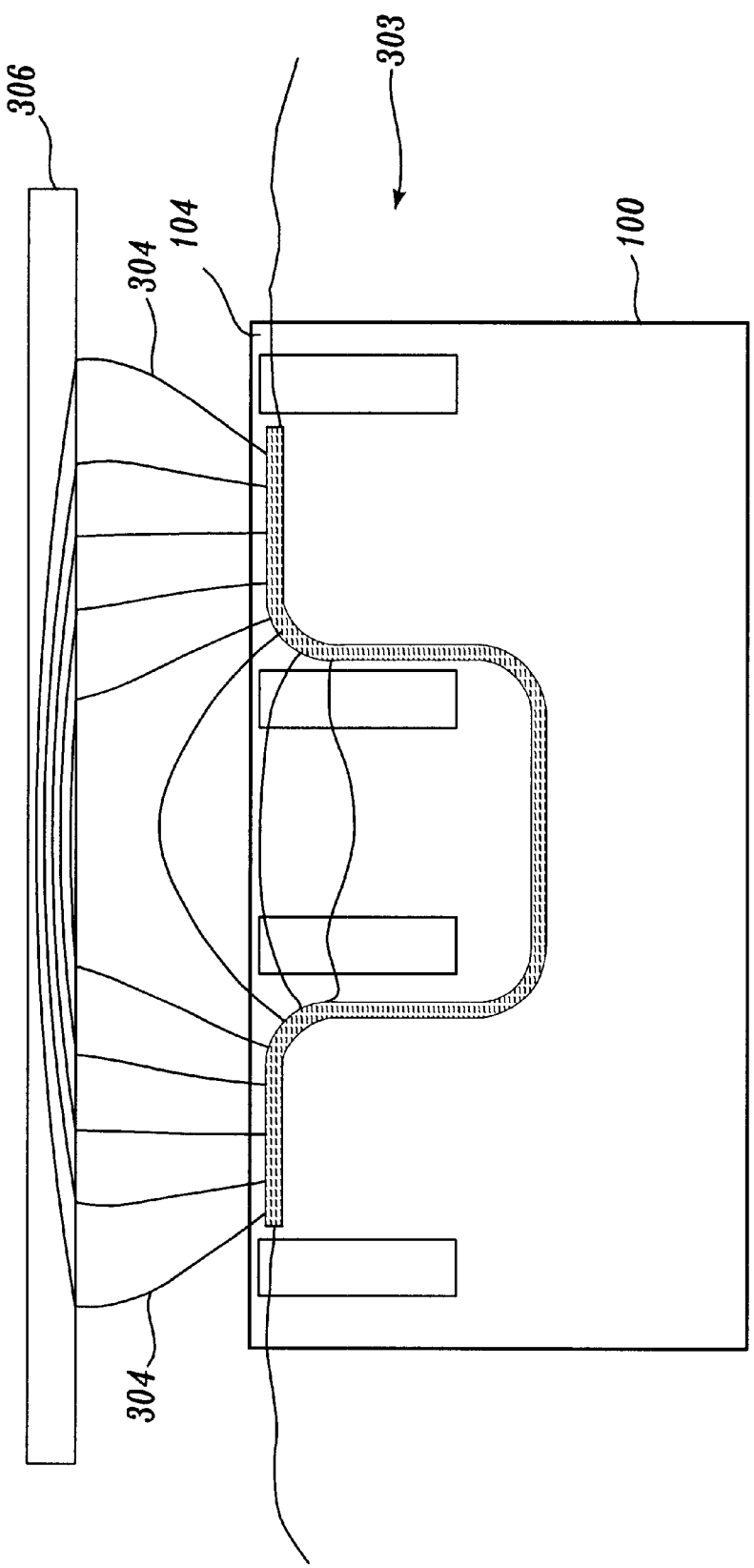
FIG. 9 is a somewhat diagrammatic top plan of a proximity sensor in accordance with the present invention adjacent to a permeable target.

When the proximity sensor 100 is used as a variable reluctance sensor, the configuration of the proximity sensor 100 is somewhat different than the configuration shown in FIG. 7. FIG. 9 shows an apparatus 303 with the proximity sensor 100 adjacent to a permeable target 306. When the proximity sensor 100 is used as a variable reluctance sensor, the proximity sensor 100 generates an alternating magnetic field as illustrated by the flux lines 304.

To detect the presence of permeable materials, an external alternating current source is used to drive the coils of the proximity sensor 100. When the permeable target 306 is moved into the magnetic field of the proximity sensor 100, the reluctance between the permeable target 306 and proximity sensor 100 changes. This change in reluctance increases the inductance of the sensing coils. Thus, an inductance measuring circuit can be used to detect the presence of the permeable target 306.

Figure 10:
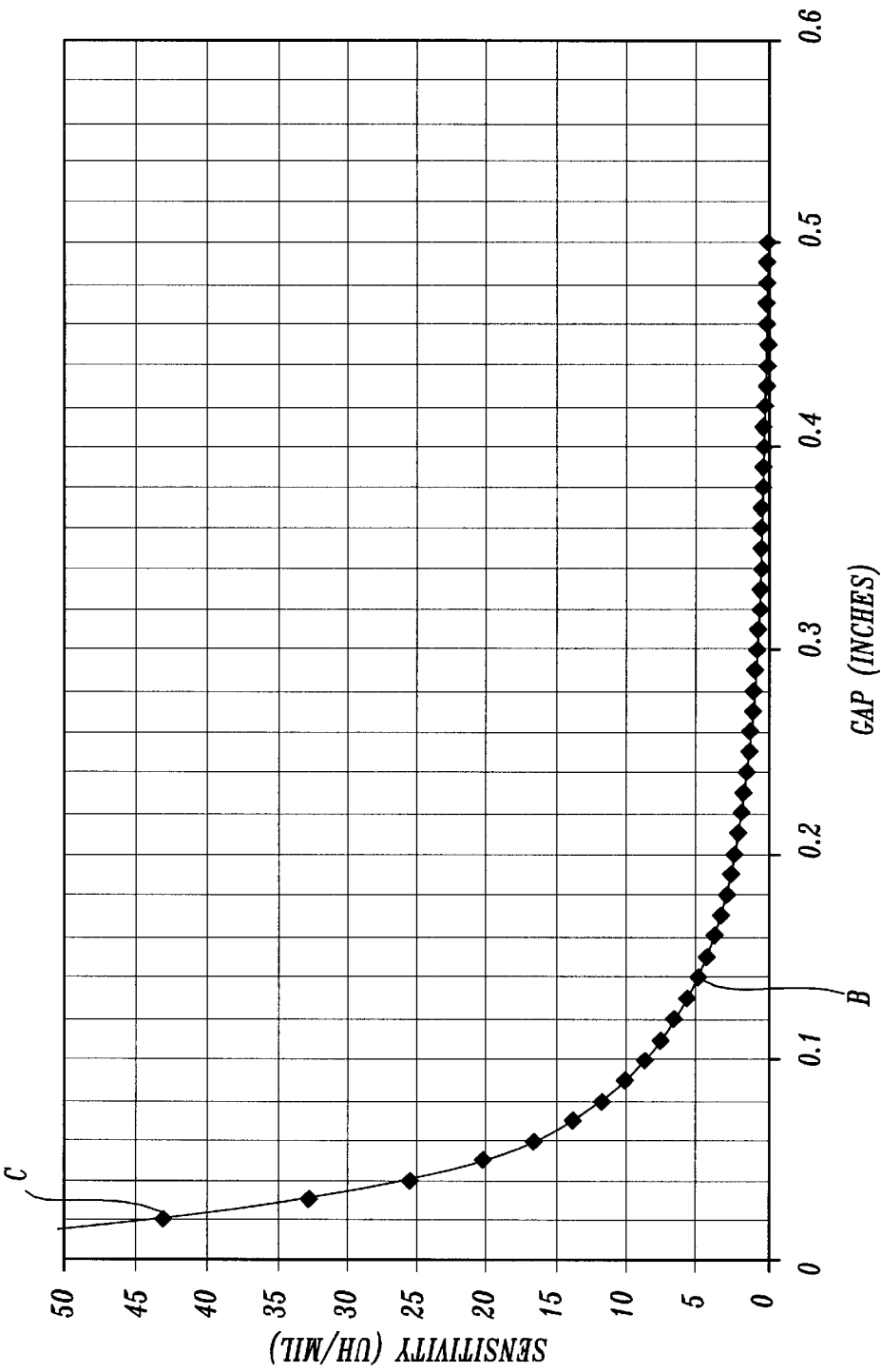
FIG. 10 is a graph showing the sensitivity of the sensor coils versus the distance between the permeable target as the proximity sensor is used in the variable reluctance mode.

FIG. 10 is a graph of the coil sensitivity as a function of the distance between a permeable target 306 and the proximity sensor 100. The sensitivity of the proximity sensor 100 is measured in units of microhenrys per Mil. For example, if the permeable target 306 moves one Mil, with a distance of 0.14 inches between the proximity sensor and the permeable target 306, the coils' inductance changes by five microhenrys (as indicated by point B). If the permeable target 306 is 0.02 inches away from the proximity sensor 100 and moves one Mil, the coils' inductance changes by 42 microhenrys (as indicated by point C). The sensitivity of the proximity sensor 100 increases at an exponential rate as the permeable target 306 moves toward the proximity sensor 100. In this configuration, the coil inductance increases as the permeable target 306 moves toward the proximity sensor 100.

When the proximity sensor 100 is used as an eddy current loss sensor to detect conductive targets, the configuration of the proximity sensor 100 is similar to the configuration of the variable reluctance sensor as shown in FIG. 9.

However, the inductance of the coils has a different reaction to the conductive targets compared to the permeable targets.

Figure 11:
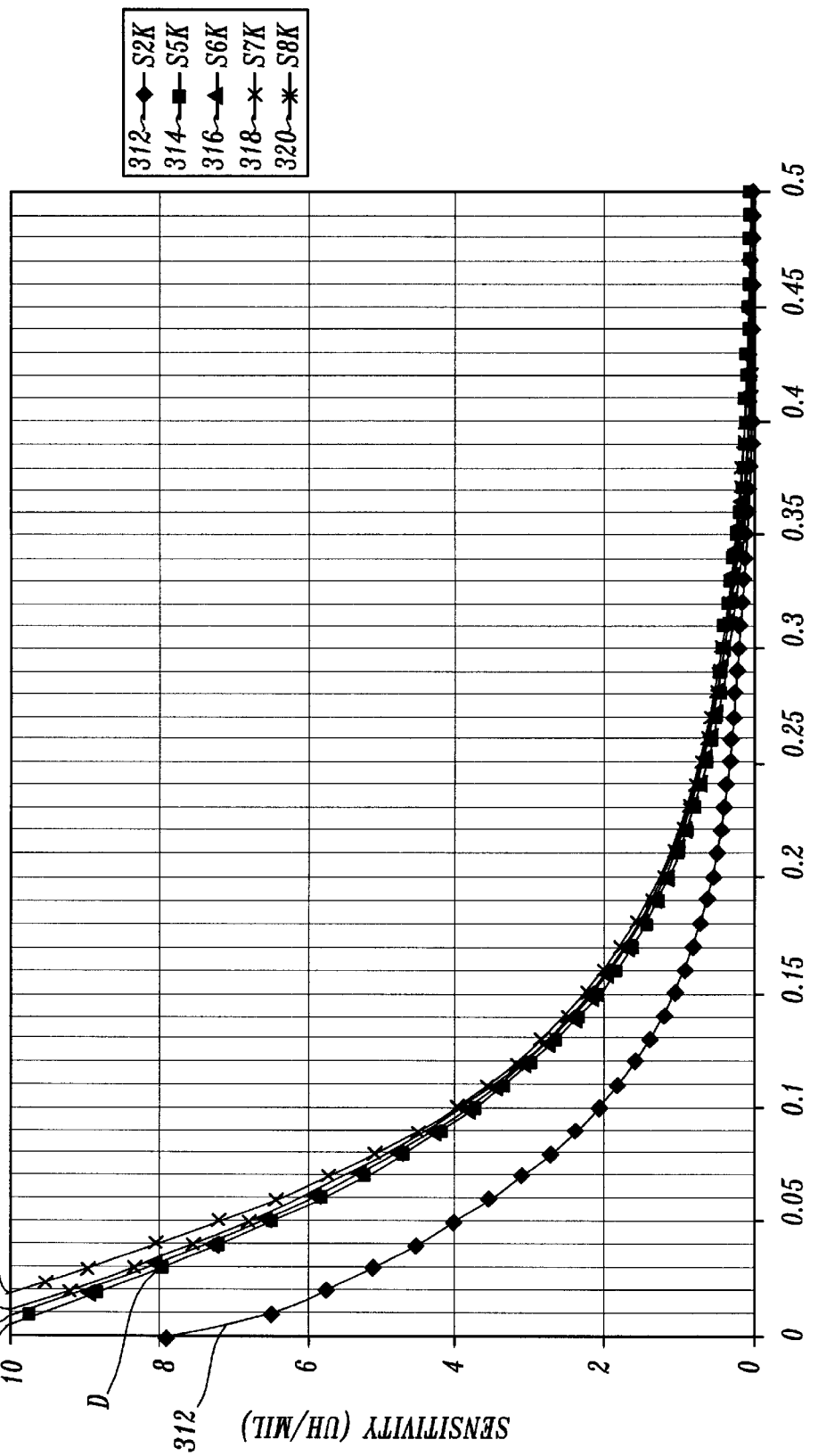
FIG. 11 is a graph showing the sensitivity of the sensor coils versus the distance between the permeable target as the proximity sensor is used in the eddy current loss mode.

The proximity sensor shown in FIG. 9 is also used to describe the eddy current configuration, only the target 306 now consists of a conductive, nonpermeable target such as aluminum or copper. When the conductive target 306 is moved into the magnetic field 304 of the proximity sensor 100, the conductive target 306 will intercept a portion of the magnetic field 304 produced by the alternating current fed into the coil. This interception of the magnetic field 304 induces eddy currents in the conductive target 306 that are temporally (ninety degrees) out of phase with the source current. In turn, these eddy currents do two things; they dissipate energy as heat within the conductor and generate another magnetic field. The magnetic field generated by the eddy currents within the conductive target 306 opposes the magnetic source field 304 eventually causing additional currents back in the sensor coils. Thus, when the conductive target 306 enters the magnetic source field 304, the current in the coils increases. This reaction in the current level is detected by electronic circuitry that measures the inductance over the coil. When the conductive target 306 moves toward the proximity sensor 100, the inductance of the coils decrease, thereby indicating the presence of the conductive target 306. FIG. 11 is a graph of the coil sensitivity as a function of the distance between a conductive target and the proximity sensor. Similar to the graph of FIG. 10, the sensitivity of the proximity sensor 100 is measured in units of microhenrys per Mil. For example, if the conductive target moves one Mil, with a distance of 0.03 inches between the proximity sensor and the conductive target, the coils' inductance changes by eight microhenrys (as indicated by point D). In this configuration, the inductance of the coils decreases as the conductive target is moved toward the proximity sensor. Thus, the present invention provides a highly sensitive proximity sensor that operates in the eddy current loss mode to detect the presence of a conductive, non-permeable target by simply measuring the inductance in the coils.

The graph of FIG. 11 also displays the performance levels of the proximity sensor 100 at different operating frequencies. The first line 312 reveals the sensitivity of the proximity sensor when the source current is at 2 KHz. As shown by the other lines 314–320 corresponding with other operating frequencies of 5, 6, 7 and 8 KHz, the performance of the proximity sensor peaks at 8 Khz and decreases as the frequency increases.

As with the embodiment utilizing the proximity sensor as a saturated core sensor, the physical dimensions of the core together with the dimensions and configuration of coil determine sensor's ability to detect targets at an optimal distance. The unique design of the core and the placement of the coils provide a variable reluctance and eddy current loss proximity sensor having the performance characterized in the graphs of FIGS. 10 and 11. As a result of the unique shape and dimensions of the core, the proximity sensor 100 is able to detect variations in the source magnetic field (304 of FIG. 9) at a greater distance away from the proximity sensor 100 than a conventional U-type core of an equivalent size.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A proximity sensor, comprising:
    a core of omega shape having a central part, two foot portions on opposite sides of the central part and two legs each extending between one of the foot portions and the central part;
    a calibration bolt aligned in a position perpendicular to the central part of the core, and wherein the calibration bolt is inserted through the center of the central part of the core; and
    a first sensing coil operatively associated with the core such that the core influences an electrical signal in the first sensing coil, and wherein the calibration bolt is operatively associated with the first sensing coil and the core such that the calibration bolt adjusts the electric signal in the first sensing coil.

2. The proximity sensor of claim 1, wherein the legs are elongated and extend transversely of the central part and the foot portions.

3. The proximity sensor of claim 1, further comprising a second sensing coil positioned around the core, wherein the first and second sensing coils have turns wrapped around the legs, respectively.

4. The proximity sensor of claim 1, wherein the core is constructed from a substantially rectangular member having a plurality of substantially rectangular surfaces forming the central part, foot portions and legs, each defining a plane, the plane of the central part being substantially perpendicular to the plane of each of the legs, the plane of the central part being substantially parallel to the plane of each of the foot portions, the first and second foot portions being adjacent to the first and second legs, respectively.

5. The proximity sensor of claim 1, further comprising circuitry coupled to the sensing coil, for sensing an object located in a sensing region adjacent to the core.

6. The proximity sensor of claim 5, wherein the circuitry also energizes the sensing coil to create the sensing region of the core.

7. The proximity sensor of claim 1, wherein the core has a thickness of approximately 0.020 inches.

8. The proximity sensor of claim 1, wherein the central part of the core has a width of approximately 0.370 inches and a length of approximately 0.390 inches.

9. The proximity sensor of claim 1, wherein the legs have a first width adjacent to the central part and a second width, different from the first width, remote from the central part.

10. The proximity sensor of claim 1, wherein the leg portions have a length of approximately 0.300 inches, a first width of approximately 0.370 inches extending approximately 0.050 inches from the central part, and a second width of approximately 0.292 inches extending approximately 0.250 inches beyond the first width.

11. The proximity sensor of claim 1, further comprising a housing supporting the sensing coil and the core.

12. The proximity sensor of claim 1, wherein the width of the central part of the core is greater than the width of the two leg portions and the foot portions.

13. The proximity sensor of claim 1, wherein the core also comprises an aperture centered therein and sized to receive the calibration bolt.

14. The proximity sensor, of claim 1, wherein the calibration bolt is made of a highly permeable material.

15. The proximity sensor of claim 1, wherein the calibration bolt is made of a material selected from the group consisting of soft iron, cast iron, and transformer steel.

16. The proximity sensor of claim 1, wherein the calibration bolt is made of a material having a relative permeability equal or greater than 90.

17. The proximity sensor of claim 1, wherein the position of the calibration bolt is adjustable to change a level of inductance that is measured from the first sensing coil.

18. The proximity sensor of claim 1, wherein the calibration bolt is a threaded screw.

19. An apparatus for use in a proximity sensor comprising:
    a core of omega shape having a central part, two foot portions on opposite sides of the central part and two legs portions each extending between one of the foot portions and the central portion; and
    a calibration bolt aligned in a position perpendicular to the central part of the core, wherein the calibration bolt is inserted through the center of the central part of the core, and wherein the calibration bolt is operatively associated with the core for adjusting the effective permeability of the core.

20. The core of claim 19, wherein the leg portions are elongated and extend transversely of the central part and the foot portions.

21. The core of claim 19, wherein the core is constructed from a substantially rectangular member having a plurality of substantially rectangular surfaces forming the central part, foot portions and legs, each defining a plane, the plane of the central part being substantially perpendicular to the plane of each of the legs, the plane of the central part being substantially parallel to the plane of each of the foot portions, the first and second foot portions being adjacent to the first and second legs, respectively.

22. The core of claim 19, wherein the core is made from a highly permeable metallic material.

23. The core of claim 19, wherein the core has a thickness of approximately 0.020 inches.

24. The core of claim 19, wherein the central part of the core has a width of approximate by 0.370 inches and a length approximate to 0.390 inches.

25. The core of claim 19, wherein the legs have a first width adjacent to the central part and a second width, different from the first width, remote from the central part.

26. The core of claim 19, wherein the leg portions have a length of approximately 0.300 inches, a first width of approximately 0.370 inches extending approximately 0.050 inches from the central part, and a second width of approximately 0.292 inches extending approximately 0.250 inches beyond the first width.

27. The core of claim 19, wherein the core also comprises an aperture centered therein.

28. The core of claim 19, wherein the width of the central part is greater than the width of the leg portions and the foot portions.

29. A method for detecting the presence of a magnetic object which comprises:

providing a core of omega shape having a central part, two foot portions on opposite sides of the central part and two legs each extending between one of the foot portions and the central part;

providing a calibration bolt aligned in a position perpendicular to the central part of the core, and wherein the calibration bolt is inserted through the center of the central part of the core;

providing at least one sensing coil operatively associated with the core such that the core influences an electrical signal in the first sensing coil, and wherein the calibration bolt is operatively associated with the first sensing coil and the core such that the calibration bolt adjusts the electric signal in the first sensing coil; and measuring the impedance over the sensing coil, and if the impedance varies greater than a predetermined value, generating a signal to indicate the presence of the magnetic object.

30. The method of claim 29, wherein the leg portions are elongated and extend transversely of the central part and the foot portions.

31. The method of claim 29, further comprising providing a second sensing coil positioned around the core.

32. A method for detecting the presence of a ferromagnetic object which comprises:

providing a core of omega shape having a central part, two foot portions on opposite sides of the central part and two legs each extending between one of the foot portions and the central part;

providing a calibration bolt aligned in a position perpendicular to the central part of the core, and wherein the calibration bolt is inserted through the center of the central part of the core;

providing at least one sensing coil operatively associated with the core such that the core influences an electrical signal in the first sensing coil, and wherein the calibration bolt is operatively associated with the first sensing coil and the core such that the calibration bolt adjusts the electric signal in the first sensing coil;

supplying an electronic signal to the sensing coil; and measuring the inductance over the sensing coil, and if the inductance varies greater than a predetermined value, generating a signal to indicate the presence of the ferromagnetic object.

33. The method of claim 32, wherein the leg portions are elongated and extend transversely of the central part and the foot portions.

34. The method of claim 32, further comprising providing a second sensing coil positioned around the core.

35. A method for detecting the presence of a conductive object which comprises:

providing a core of omega shape having a central part, two foot portions on opposite sides of the central part and two legs each extending between one of the foot portions and the central part;

providing a calibration bolt aligned in a position perpendicular to the central part of the core, and wherein the calibration bolt is inserted through the center of the central part of the core;

providing at least one sensing coil operatively associated with the core such that the core influences an electrical signal in the first sensing coil, and wherein the calibration bolt is operatively associated with the first sensing coil and the core such that the calibration bolt adjusts the electric signal in the first sensing coil;

supplying an electronic signal to the sensing coil; and measuring the inductance over the sensing coil, and if the inductance varies greater than a predetermined value, generating a signal to indicate the presence of the conductive object.

36. The method of claim 35, wherein the leg portions are elongated and extend transversely of the central part and the foot portions.

37. The method of claim 35, further comprising providing a second sensing coil positioned around the core.

38. A proximity sensor, comprising:

a core of omega shape having a central portion, two foot portions on opposite sides of the central portion and two leg portions each extending between one of the foot portions and the central portion;

a calibration bolt inserted through the center of the central portion of the core; and a first sensing coil positioned around at least one portion of the core, and wherein the calibration bolt is operatively associated with the first sensing coil and the core, such that the calibration bolt influences an electrical signal in the first sensing coil.

39. The proximity sensor, of claim 38, wherein the calibration bolt is made of a highly permeable material.

40. The proximity sensor of claim 38, wherein the calibration bolt is made of a material selected from the group consisting of soft iron, cast iron, and transformer steel.

41. The proximity sensor of claim 38, wherein the calibration bolt is made of a material having a relative permeability equal or greater than 90.

42. The proximity sensor of claim 38, wherein the position of the calibration bolt is adjustable to change a level of inductance that is measured from the first sensing coil.

43. The proximity sensor of claim 38, wherein the calibration bolt is a threaded screw.

44. The proximity sensor of claim 38, further comprising circuitry coupled to the sensing coil, for sensing an object located in a sensing region adjacent to the core.

45. The proximity sensor of claim 44, wherein the circuitry also energizes the sensing coil to create the sensing region of the core.

46. The proximity sensor of claim 38, wherein the core has a thickness of approximately 0.020 inches.

47. The proximity sensor of claim 38, wherein the legs have a first width adjacent to the central part and a second width, different from the first width, remote from the central part.

48. The proximity sensor of claim 38, wherein the legs have a length of approximately 0.300 inches, a first width of approximately 0.370 inches extending approximately 0.050 inches from the central part, and a second width of approximately 0.292 inches extending approximately 0.250 inches beyond the first width.

* * * * *

UNITED STATES PATENT AND TRADEMARK OFFICE
CERTIFICATE OF CORRECTION

PATENT NO.     : 6,424,145 B1
DATED          : July 23, 2002
INVENTOR(S)    : K. Woolsey et al.

It is certified that error appears in the above-identified patent and that said Letters Patent is hereby corrected as shown below:

Title page,
Item [73], Assignee, "Eldec" should read -- ELDEC --
Item [57], ABSTRACT,
Line 2, "magnetic permeable" should read -- magnetic, permeable --

Signed and Sealed this

Eighteenth Day of February, 2003

JAMES E. ROGAN
*Director of the United States Patent and Trademark Office*